United States Patent
Aoki

(10) Patent No.: US 7,933,304 B2
(45) Date of Patent: Apr. 26, 2011

(54) SEMICONDUCTOR LASER DIODE AND OPTICAL MODULE EMPLOYING THE SAME

(75) Inventor: Masahiro Aoki, Kokubunji (JP)

(73) Assignee: Opnext Japan, Inc., Kanagawa (JP)

( * ) Notice: Subject to any disclaimer, the term of this patent is extended or adjusted under 35 U.S.C. 154(b) by 685 days.

(21) Appl. No.: 11/705,406

(22) Filed: Feb. 13, 2007

(65) Prior Publication Data

US 2008/0144682 A1   Jun. 19, 2008

(30) Foreign Application Priority Data

Dec. 14, 2006   (JP) ................................. 2006-337384

(51) Int. Cl.
*H01S 3/08* (2006.01)
(52) U.S. Cl. ....................... 372/96; 372/44.01
(58) Field of Classification Search ............... 372/96
See application file for complete search history.

(56) References Cited

U.S. PATENT DOCUMENTS

2003/0063645 A1* 4/2003 Yoshida et al. ............. 372/49
2006/0118893 A1* 6/2006 Behfar et al. ............... 257/414

FOREIGN PATENT DOCUMENTS

JP   2004-235182   8/2004

OTHER PUBLICATIONS

Itaya et al., "Low Threshold Current GaInAsP/InP DFB Lasers", 1987, IEEE, Journal of Quantum Electronics, 23, 828-834.*
Hornung et al., "Simple Approach for Monolithic Integration of DFB Laser and Passive Waveguide", 1991, IEEE, Electronics Letters, 27, 1683-1685.*
2003 IEEE 16$^{th}$ LEOS Conference Digest (lasers and Electro-Optics Society 16$^{th}$ Annual Meeting of the IEEE), vol. 2, Oct. 27-28 pp. 511-512.
"2003 Optical Fiber Communication Conference (OFC) Digest", Mar. 3-28 , PD40-1, 2, 3.

* cited by examiner

*Primary Examiner* — Minsun Harvey
*Assistant Examiner* — Joshua King
(74) *Attorney, Agent, or Firm* — Antonelli, Terry, Stout & Kraus, LLP.

(57) ABSTRACT

It is an object of the present invention to realize a low cost laser light source capable of emitting several mW optical power while the operation current is reduced. In particular, the present invention concerns a 1.3 μm wavelength band laser device suitable for several to several ten km short distance fiber optic transmission and also a less power consuming optical communication module in which such a laser is preferably mounted. As a laser structure which eliminates the necessity of adding an optical isolator by providing improved immunity to reflected light while lowering the operation current for less power consumption and not lowering the response speed, a short cavity laser which operates in multiple longitudinal modes is introduced. Especially, an angled mirror structure is formed at the laser's emitting edge to change the optical output direction so that the light is emitted from the top or bottom of the substrate.

5 Claims, 10 Drawing Sheets

| SURFACE EMITTING LASER | | REMARKS: ISOLATOR |
|---|---|---|
| HCSEL (HORIZONTAL CAVITY SURFACE EMITTING LASER) | | |
| SINGLE LONGITUDINAL MODE HCSEL  κL~1.0-1.5 | (g) κSMALL  50-100μm | NECESSARY |
| (PRESENT INVENTION) MULTI LONGITUDINAL MODE VCSEL  κL~2.5-5.0 | (h) κLARGE  50-100μm | NOT NECESSARY |

FIG. 2A (Prior Art)

ELL (EDGE EMITTING LASER)

| | | | REMARKS: ISOLATOR |
|---|---|---|---|
| (a) | CONVENTIONAL FP TYPE | 200~250μm, LR-cort / HR-cort | NOT NECESSARY |
| (b) | CONVENTIONAL DISTRIBUTED FEEDBACK (DFB TYPE) | 200~250μm, AR-cort / HR-cort | NECESSARY |
| (c) | SHORT-RESONATOR DISTRIBUTED FEEDBACK (DFB TYPE) | 200~300μm, 50~100μm, AR-cort / HR-cort | NECESSARY |
| (d) | SHORT-RESONATOR DISTRIBUTED BRAGG REFLECTOR (DBR TYPE) | 200~300μm, 10~100μm, AR-cort / HR-cort | NECESSARY |

FIG. 3

| | SURFACE EMITTING LASER | REMARKS: ISOLATOR |
|---|---|---|
| HCSEL (HORIZONTAL CAVITY SURFACE EMITTING LASER) | (g) SINGLE LONGITUDINAL MODE HCSEL $\kappa L \sim 1.0\text{-}1.5$ | NECESSARY |
| | (h) (PRESENT INVENTION) MULTI LONGITUDINAL MODE VCSEL $\kappa L \sim 2.5\text{-}5.0$ | NOT NECESSARY |

FIG. 12

| COMPONENT | COST (¥) | RATIO (%) |
|---|---|---|
| DFB-LD CHIP | 1500 | 16.9 |
| AFD CHIP | 2800 | 31.6 |
| ANALOG PD | 500 | 5.6 |
| TIA | 150 | 1.7 |
| ASPHERIC LENS | 500 | 4.5 |
| ISOLATOR | 2000 | 22.6 |
| WDM FILTER | 400 | 4.5 |
| PIGTAIL FIBER | 800 | 9.0 |
| METAL CASE | 300 | 3.4 |
| TOTAL | 8850 | 100.0 |

US 7,933,304 B2

SEMICONDUCTOR LASER DIODE AND OPTICAL MODULE EMPLOYING THE SAME

CLAIM OF PRIORITY

The present application claims priority from Japanese application JP2006-337384, filed on Dec. 14, 2006, the content of which is hereby incorporated by reference into this application.

BACKGROUND OF THE INVENTION

1. Field of the Invention

The present invention relates to semiconductor laser devices and optical modules employing them. In particular, the invention relates to low power consumption light emitting/receiving semiconductor devices suitable for optical communications and the like.

2. Description of the Related Arts

With the rapid development of information technology, not only conventional communication (telecommunication) networks but also SAN (Storage Area Network), Ethernet (LAN) and other data communication networks, which have been progressed remarkably, are growing in system capacity. Accordingly, it is becoming important more and more to allow more channel ports to be installed economically. The throughput of a high speed interface apparatus is limited by the speed of each channel port and the installed channel port density which depends on the size and power consumption of each channel port module. Therefore, reducing the size and power consumption of its main part, namely an optical component is now the key which determines the total performance of such an apparatus.

Thus, lower power consumption has become an important goal for optical transceiver modules each of which transmits and receives optical signal by its internal semiconductor laser and semiconductor photo detector.

In FIG. 1, transmitter light sources used for optical transceiver modules at 10 Gbps operation are classified by power consumption and fiber link distance. The figure indicates the existence of a tradeoff relation between the fiber link distance and power consumption of each module. This is because a different optoelectronic device is used for each distance range as shown in the figure. In short distance applications, directly modulated 1.3 and 0.85 µm wavelength band devices are typically used to transmit optical signals. In more detail, 0.85 µm wavelength band multimode vertical cavity surface emitting lasers (Non-patent Document 1: "2003 IEEE 16th LEOS Conference Digest (Lasers and Electro-Optics Society 16th Annual Meeting of the IEEE)", Volume 2, 27-28 October pp. 511-512) are used as directly modulated light sources for very short distance transmissions up to 100 m. In short distance applications up to 10 km, 1.3 µm band single mode edge emitting lasers (Non-patent Document 2: "2003 Optical Fiber Communications Conference (OFC) Digest", 3-28 March, PD40) are used as directly modulated light sources. The direct modulation method can realize a low power consumption module because the module's structure is relatively simple. In particular, surface emitting lasers are substantially superior in power saving since their micro cavity structure, shorter than 1 µm, can operate at a very small current of several to ten mA. They are also economically superior since their lasing structure can all be fabricated by wafer process and on-wafer testing/sorting is possible. In the case of edge emitting lasers for the 1.3 µm wavelength band, since a minimum of about 60 mA must continue to be injected for a state of the art edge emitting laser to operate at 10 Gbps, consuming roughly twice as much power. Therefore, research is earnestly being carried out in order to apply 1.3 µm wavelength band surface emitting lasers in short distance applications up to 10 km. However, it is technically still difficult to realize a single transverse mode structure chip capable of outputting several mW level optical power although this must be cleared for practical use. This is because the volume of the light emitting layer is too small. As shown in the above-cited Non-patent Document 2, a typical 1.3 µm wavelength band surface emitting laser sharply reduces its optical output power to about several hundred pW at high temperature if the emitting area size is designed to be 5 µm or smaller to secure single mode operation. Although it is possible to attain about 1 mW output power by enlarging the emitting area size to the order of 10 µm, this causes multimode operation.

In middle and long distance applications beyond 40 km, 1.55 µm wavelength band lasers are used and externally modulated by optical modulators which operate in the 1.55 µm band. This reduces the fiber optic transmission loss but results in increased power consumption. Further, laser modules in present wavelength division multiplexing (WDM) transmission systems are required to consume several times more power than those in short distance transmission systems since additional power consumption is needed to stabilize the wavelengths of wavelength-tunable light sources.

As for the cost of manufacturing a laser module, it is critical whether an optical isolator is needed or not. Shown in FIG. 12 (Table 1) are the costs of the individual components which constitute an exemplary optical module, namely an optical transceiver module for TTH (Fiber to the Home) applications. As shown in the table, the optical isolator occupies more than a fifth of the total cost. Thus, in addition to the aforementioned miniaturization and power saving efforts, it has become important to make optical modules free of optical isolators by improving the immunity of their laser light sources to reflected light. Typically, an optical isolator is used to prevent the quality of optical signal from degenerating since light emitted from the laser light source may be reflected inside and/or outside the module and return to the lasing cavity. Especially, in the case of a semiconductor laser for long distance transmission applications, an optical isolator is indispensable since the spectral characteristics of the light source are severely required to be stable. From this point of view, FIGS. 2A and 2B summarize present semiconductor lasers, showing their cavity structures and indicating whether they need optical isolators. As understood from the figures, the Fabry-Perot (FP) laser (FIG. 2(a)) and multi transverse mode VCSEL (Vertical Cavity Surface Emitting Laser)(FIG. 2(f)), both for short distance applications, do not need optical isolators. In the case of the distributed feedback (DFB) laser (FIG. 2(b)(c)), distributed Bragg reflector (DBR) laser (FIG. 2(d)) and single transverse mode VCSEL laser (FIG. 2(e)), their optical modules are constructed on the condition that optical isolators are to be provided, because the immunity to coherency reflected light is degenerated due to making single mode. The distributed feedback (DFB) and distributed Bragg reflector (DBR) lasers which respectively feature short lasing cavities are described in Japanese Patent Application No. 2005-184588. A well know example of the short lasing cavity FP laser is described in Patent Document 1 (Japanese Patent Laid-Open No. 2004-235182).

SUMMARY OF THE INVENTION

The present invention is intended to realize a low cost laser light source capable of emitting several mW optical power while the operation current, which is the key for less power consumption, is reduced. In particular, it is important to realize a 1.3 μm wavelength band laser device suitable for several to several ten km short distance fiber optic transmission. It is an object of the present invention to realize a more economical laser light source which eliminates the necessity of adding an isolator and outputs optical power like a surface emitting laser.

As well, it is also an object of the present invention to realize a less power consuming optical communication module in which such a laser is preferably mounted.

As a novel laser structure which eliminates the necessity of adding an optical isolator by providing improved immunity to reflected light while lowering the operation current for less power consumption and not sacrificing the response speed, the inventors devised a short cavity laser which operates in multiple longitudinal modes.

FIG. 3 shows the gist of the present invention in comparison with a conventional structure. Shown in FIG. 3(h) is a new laser structure devised as the above-mentioned optimum lasing structure. This is a short cavity laser which operates in multiple longitudinal modes as mentioned above. The coherency is intentionally lowered by this multi longitudinal mode oscillation. Although isolator free lasers have already been realized by conventional FP lasers (FIG. 2A(a)) and multi transverse mode VCSELs (FIG. 2(f)) designed to operate in multi longitudinal modes, it hasn't been possible yet to realize a structure capable of stably providing several mW optical output without consuming more than 10 mA. In addition, a slant mirror structure is introduced in order to realize the economical advantage specific to surface emitting lasers. Formed at the laser's emitting edge, the slant mirror changes the optical output direction so that the light is emitted from the top or bottom of the substrate. Thus, the structure of the present invention can simultaneously realize all of multimode operation, several mW optical output and surface emission although this has so far been impossible.

According to the present invention, it is possible to realize a low cost laser device capable of emitting several mW optical power without having to increase the operation current which is the key for less power consumption. In particular, the present invention can realize a 1.3 μm wavelength band laser device suitable for several to several ten km short distance fiber optic transmission. Since this laser device can be isolator free and due to the surface emission, module construction cost is lower. In addition, it is possible to realize a low heat build-up and less power consumption optical communication module by appropriately mounting the laser therein.

BRIEF DESCRIPTION OF THE DRAWINGS

FIG. 2A shows the structures of conventional semiconductor lasers and indicates whether they need optical isolators;

FIG. 3 shows the structure of a conventional semiconductor laser and that of a semiconductor laser in accordance with the present invention and indicates whether they require optical isolators;

FIG. 12 is a table listing the costs of the individual components constituting an optical transceiver module for FTTH (Fiber to the Home) applications.

DETAILED DESCRIPTION OF THE PREFERRED EMBODIMENTS

Embodiments of the present invention will be described below with reference to FIGS. 4 through 9.

Embodiment 1

Figure 1:
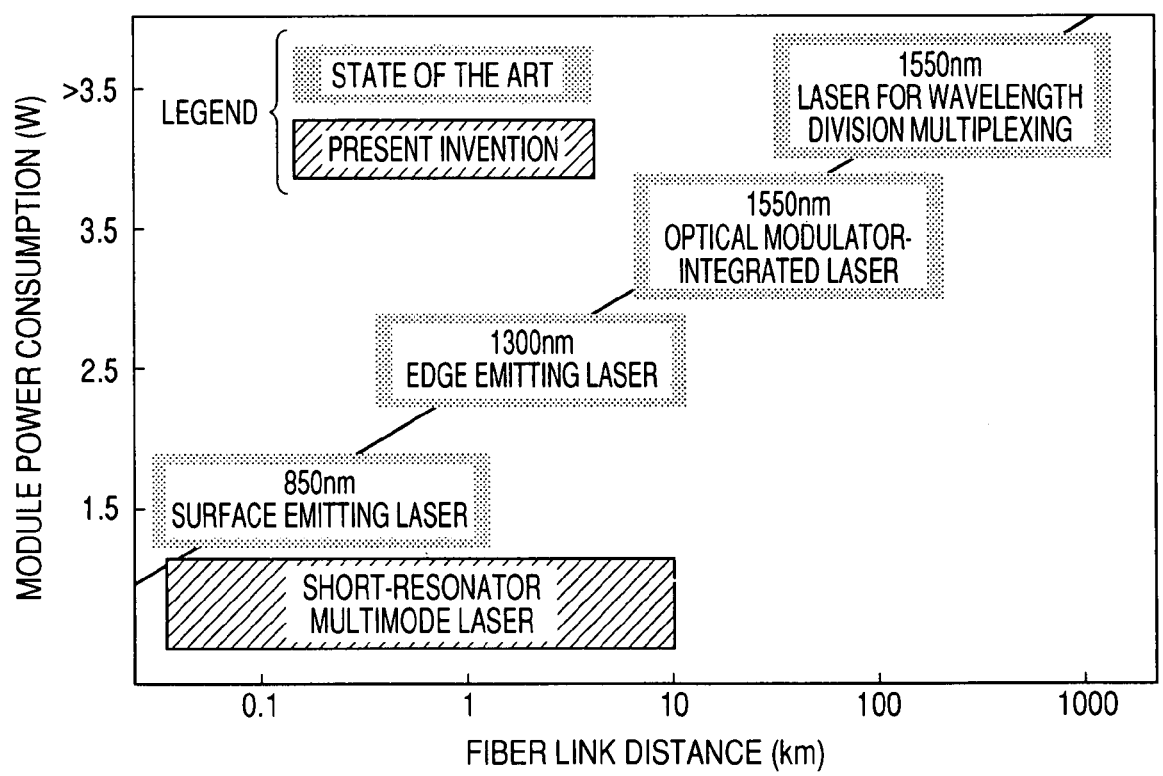
FIG. 1 shows relations between the power consumptions of optical transceiver modules and their fiber link distances.
Figure 2B:
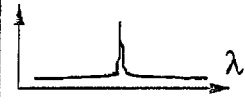
FIG. 2B shows the structures of conventional semiconductor lasers and indicates whether they need optical isolators.
Figure 4:
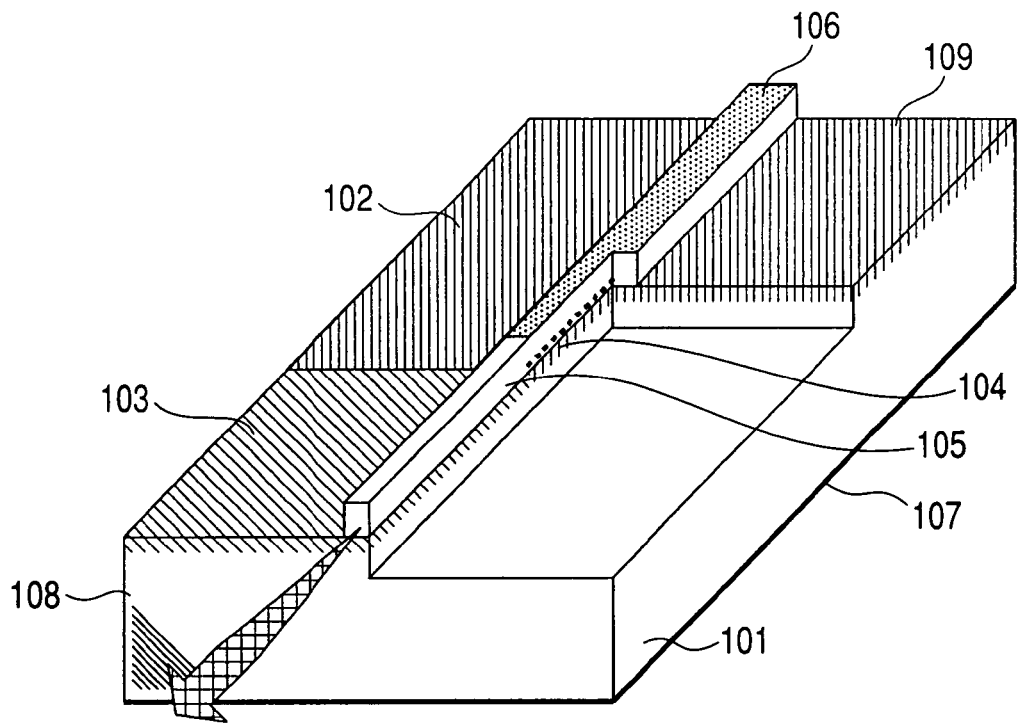
FIG. 4 is a perspective view of a semiconductor laser according to a first embodiment of the present invention.

FIG. 4 is a perspective view of a 1.3 μm wavelength band InGaAlAs-based short cavity multimode laser according to a first embodiment of the present invention.

This device was prepared as described below. At first, a strained MQW active layer 102 made of InGaAlAs was grown on a n-type InP substrate 101 by metal organic vapor phase epitaxy. On the top of this layer 102, a diffraction grating fabrication layer (InGaAsP (composition wavelength 1.2 μm) 100 nm) (not shown in the figure) was grown for later forming of a diffraction grating layer 104.

Then, after the InGaAlAs-MQW layer 102 was partially etched by using a dielectric stripe mask, a waveguide layer 103 made of 300 nm thick bulk InGaAsP (composition wavelength 1.10 μm) was integrated by a well known butt joint method. Then, a uniform diffraction grating 104 with a period of about 202 nm was imprinted only on the InGaAsP diffraction grating fabrication layer by the ordinary interference exposure method and wet etching method. This diffraction grating was designed to be 100 nm in depth and have an optical reflection coefficient (κ) of about 600 $cm^{-1}$. Then, a p-type InP cladding layer and a $p^+$-InGaAs contact layer 105 were grown over the whole surface of the substrate. Following the epitaxial process, an ordinary ridge waveguide structure was formed. A top electrode 106 was formed only on the laser portion. The active layer region length, which serves as a critical important parameter, was designed to be 50 to 100 μm. Including the waveguide layer length, the device length is about 300 μm.

Figure 11:
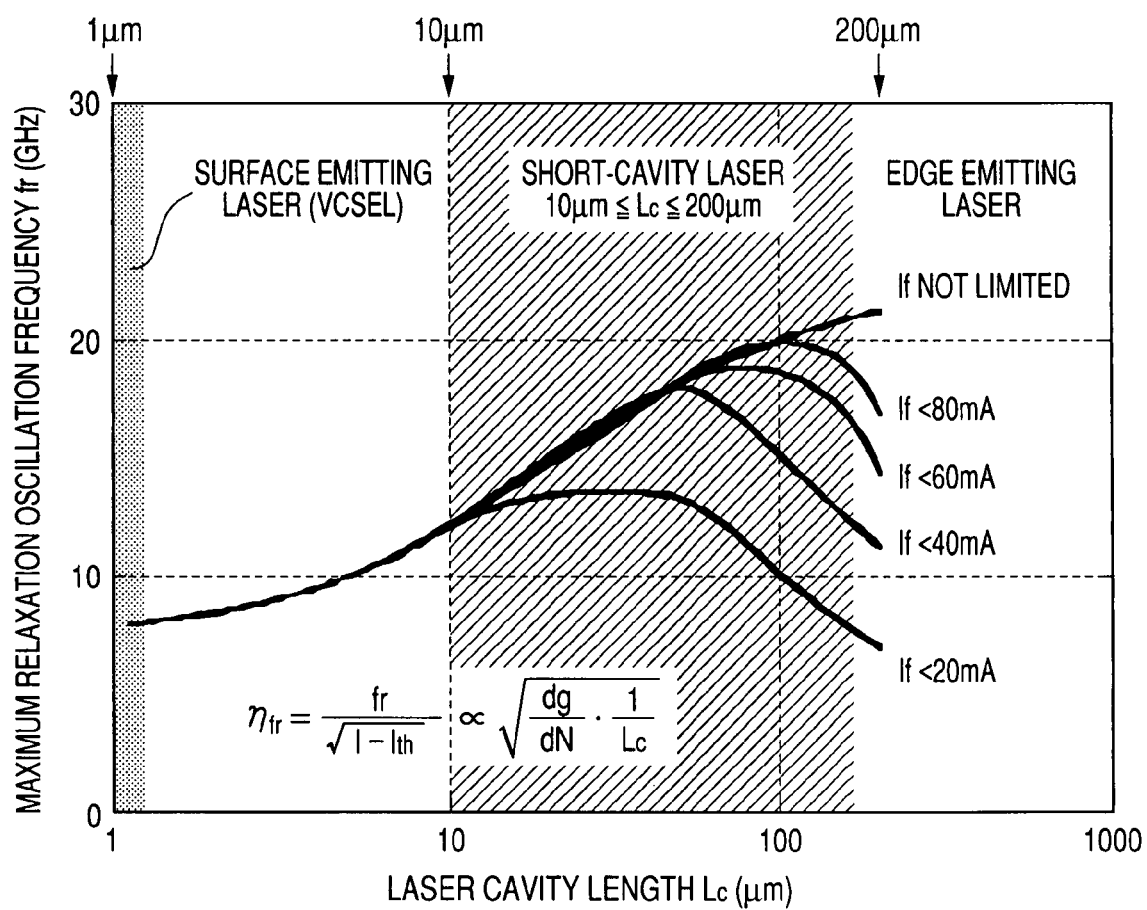
FIG. 11 shows how the maximum relaxation oscillation frequency (fc) depends on the lasing cavity length (Lc)

As shown in FIG. 11, if the active layer region length (or the lasing cavity length (Lc)) of a laser is in the range between 10 and 200 μm, the laser has an enough higher response speed (or the maximum relaxation oscillation frequency (fr)) than conventional vertical cavity surface emitting lasers (VCSELs) and edge emitting lasers (EELs). Thus, the present laser embodiment was designed so that the active layer region length falls within this range. The front face (on the DBR region side) was provided with a low reflectivity (about 0.1%) film 108 while the face was provided with a high reflectivity (about 90%) film 109. The completed device was fixed to a sub-mount by die-bonding with the junction-up configuration. Then, the device was connected to the leads via 43 O terminal resistors on the stem by wiring for high-frequency connection.

Figure 5:
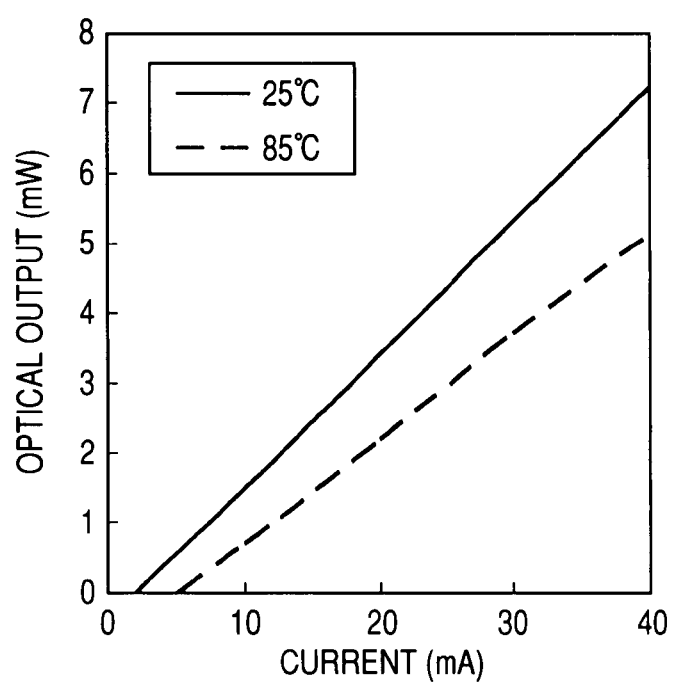
FIG. 5 is an example of a graph indicating how the current vs. optical output power characteristic of the first embodiment depends on the temperature.

At room temperature, the prepared device exhibited CW oscillation at a wavelength around 1305 nm. An example of FIG. 5 shows the temperature dependence of the current vs. light output power (I-L) characteristic of a laser with a 75 μm-long active region. The threshold current for oscillation was about 2 mA at 25° C. and about 5 mA at 85° C. These low thresholds are attributable not only to the short cavity length (75 μm) but also to the large optical feedback to the lasing cavity due to the high normalized coupling reflection coefficient κL beyond 4. For 25° C. through 85° C., the characteristic temperature $T_0$ was 55K. In addition, even at high temperature 85° C., this device showed a high output of 3 mW or more at around 30 mA.

Figure 6:
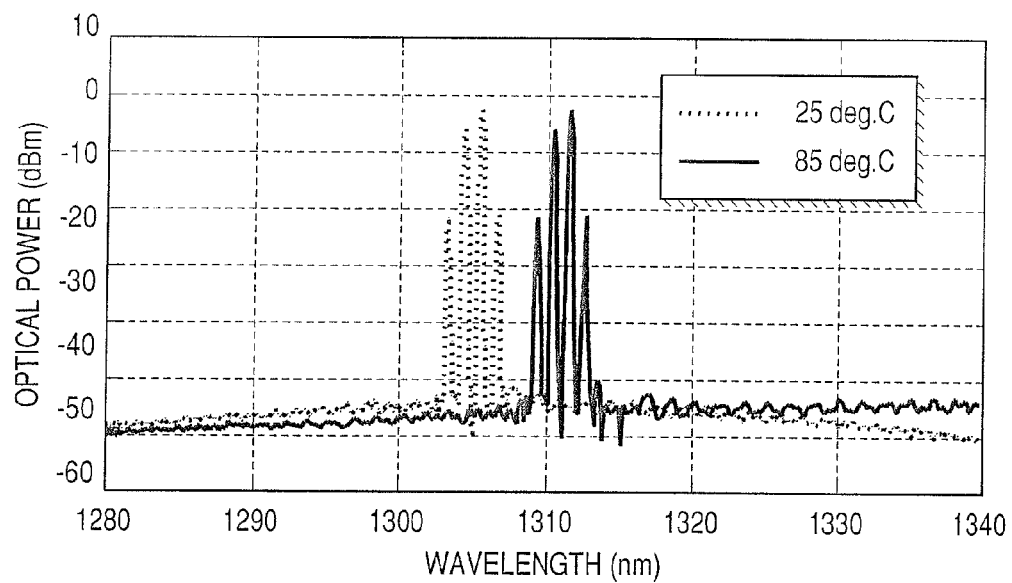
FIG. 6 shows the lasing spectrums of the first embodiment at 25° C. and 85° C. respectively.

FIG. 6 shows typical examples of lasing spectrums at 25° C. and 85° C. Probably due to small threshold/gain differences among dominant and other modes in the high reflectivity DFB structure, full multimode oscillation was obtained reproducibly.

Figure 10:
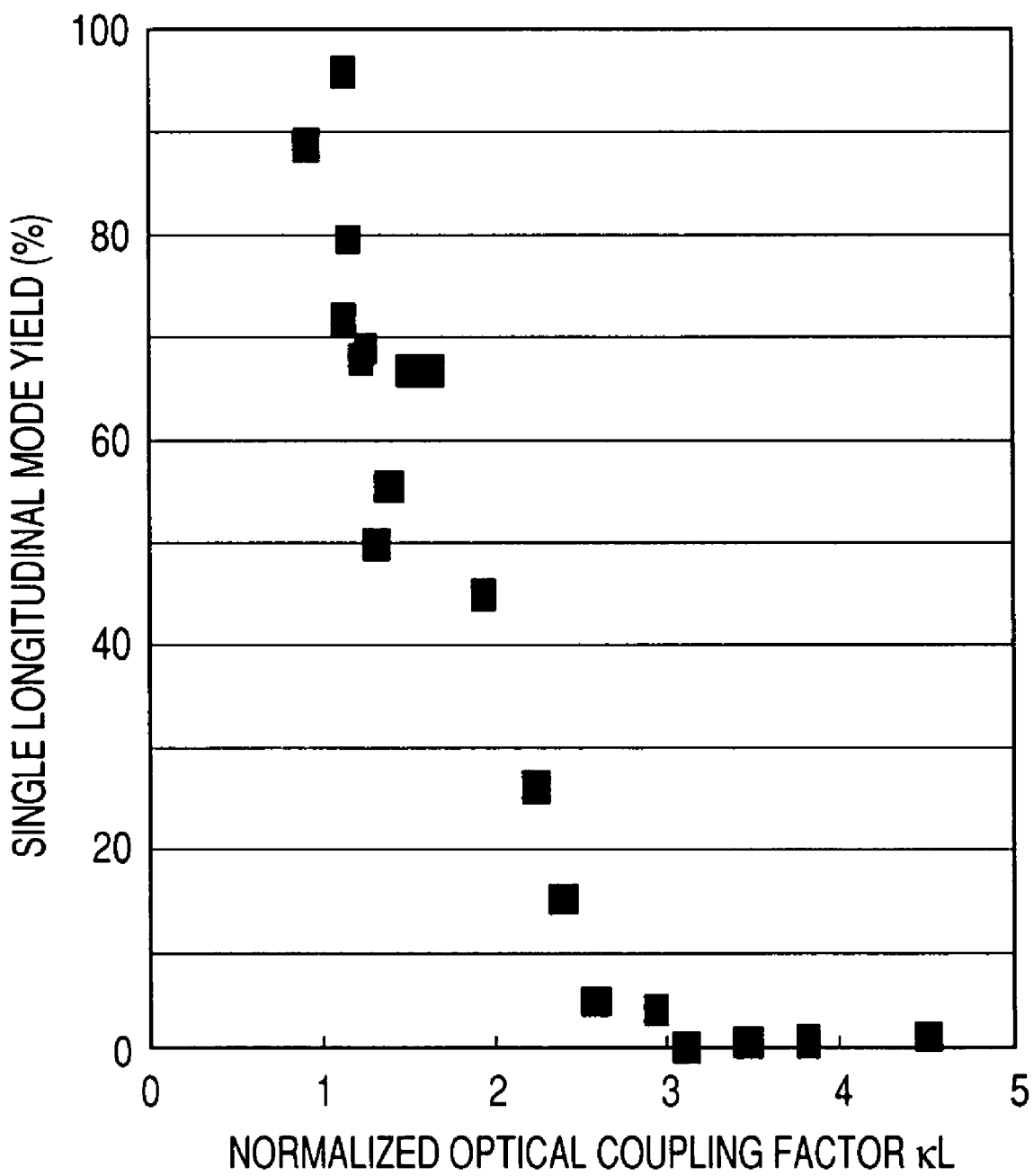
FIG. 10 shows how the single longitudinal mode yield depends on the normalized optical coupling coefficient (κL)

As indicated in FIG. 10, almost all of the randomly selected more than 30 chips having cavities of 50 to 100 μm in length exhibited multimode oscillation. As well, modulation test was performed at 10 Gbps. Clear eye openings were observed even when the device under test was driven by a very small magnitude current on the order of 10 mA. This is attributable to the shorter cavity structure which requires a smaller drive current. The optical waveform's rise/fall time was about 30 ps and the dynamic extinction ratio was not lower than 7 dB, enough high for on/off ratio in short distance transmission systems. In addition, the modulation performance and fiber transmission performance were evaluated with −14 dB or more optical feedback to the laser. The result showed that the return light causes no deterioration in performance.

Embodiment 2

Figure 7:
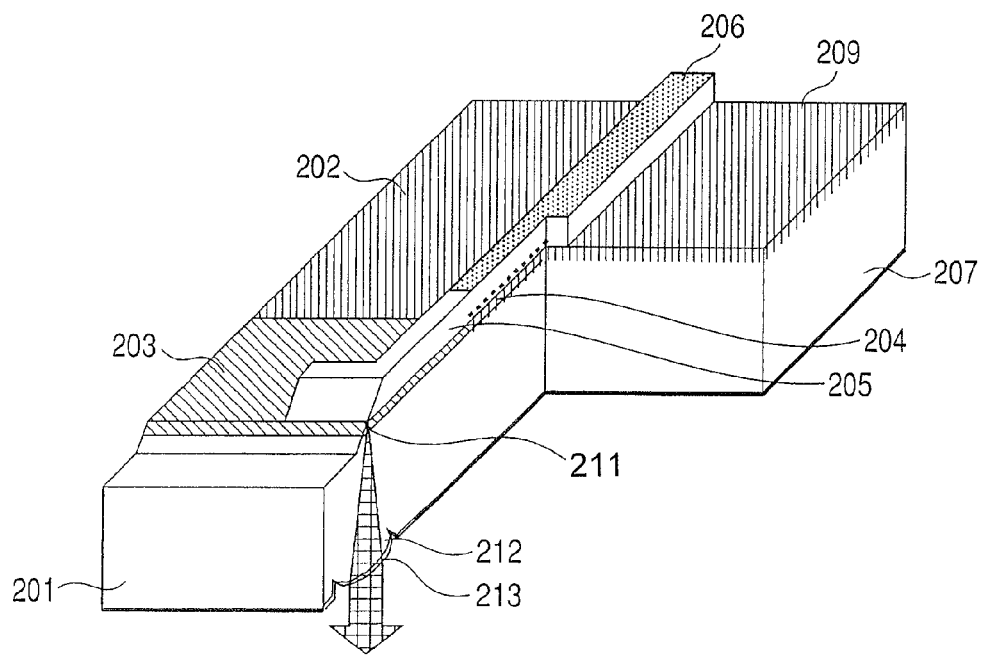
FIG. 7 is a perspective view of a semiconductor laser according to a second embodiment of the present invention.

FIG. 7 is a perspective view of another 1.3 μm wavelength band InGaAlAs-based short cavity multimode laser, a second embodiment of the present invention. Its lasing cavity structure is basically same as that of the first embodiment. However, since the present embodiment has a 45-degree total reflection semiconductor mirror 211 disposed close to its output edge, the lasing light can be taken out from the bottom of the substrate. Thus, this laser can be considered as a kind of surface emitting laser. Right below the 45-degree total reflection semiconductor mirror 211, an InP lens 212 is disposed on the bottom of the substrate. Both the 45-degree total reflection semiconductor mirror 211 and the InP lens 212 are formed by well known wet etching. Roughly, this etching accuracy is 45±5 degrees. On the surface of the InP lens 212, a reflection free coating film 213 is formed. Consequently, the lasing light is emitted from the bottom of the substrate after it passes through the front optical waveguide layer 205 and then the transparent InP substrate 201.

The present device embodiment showed almost the same characteristics as the first embodiment device. The present laser device embodiment is suitable for low power consumption and low cost optical modules since the structure provides high output power as a short cavity edge emitting laser while being economical as a surface emitting laser.

Embodiment 3

Figure 8:
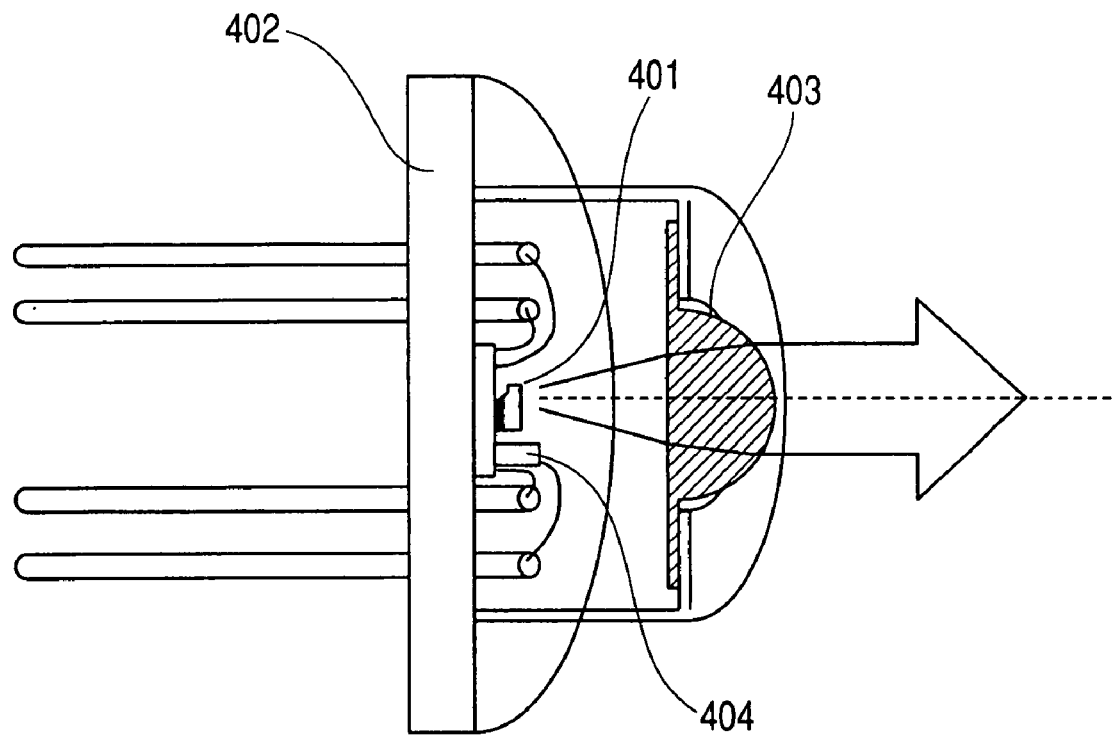
FIG. 8 is a perspective view of a can module in which the second semiconductor laser embodiment of the present invention is mounted.

FIG. 8 is a perspective view of an optical module which is a third embodiment of the present invention and uses a 1.3 μm wavelength band InGaAlAs-based short cavity multimode laser.

Figure 9:
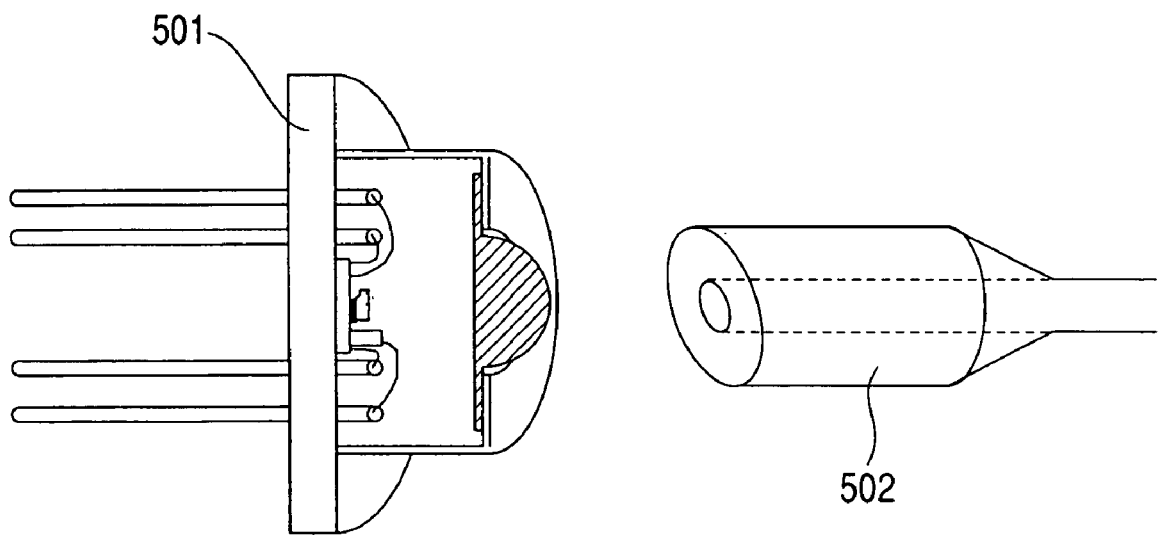
FIG. 9 is a perspective view of an optical transceiver module using the second semiconductor laser embodiment of the present invention.

A 1.3 μm wavelength band InGaAlAs-based short cavity multimode laser 401 in accordance with the second embodiment was fixed to a sub-mount by die-bonding with the junction faced downward. Then, the laser was connected to the leads via 50 Ω terminating resistors on the stem by wiring for high-frequency connection. The resulting sub-assembly was mounted on a well known can type module package 402 as shown in FIG. 8. The module was completed by mounting a monitor photodiode 404 and a cap lens 403 therein. Then, as shown in FIG. 9, this can type module 501 was directly coupled with a fiber-integrated ferrule 502 to form an optical module. In this case, no optical isolator is provided between the can type module 501 and the fiber-integrated ferrule 502.

The prepared optical module exhibited performance equivalent or superior to that of the first embodiment. Its optical output signal, modulated at 10 Gbps by a small amplitude current on the order of 10 mA, was successfully transmitted over a fiber link of about 2 km. As well, this structure provides a large economical improvement since no isolator is used as shown in FIG. 8 and therefore its optical module configuration is much simpler than the conventional ones.

While the above three embodiments of the present invention were described mainly as semiconductor lasers for optical communication, the present invention is not limited to those for optical communication. Needless to say, the present invention may be applied to any waveguide semiconductor lasers and surface emitting semiconductor lasers which are required to output an appropriate level of optical power with less power consumption.

Reference numerals used in the drawings attached to the present application are briefly described below:

101. n-type InP substrate
102. InGaAlAs strained MQW active region
103. InGaAsP optical waveguide layer
104. Diffraction grating
105. p-type InP cladding layer and p$^+$-InGaAs contact layer
106. Top electrode
107. Bottom electrode
108. Low-reflectivity film
109. High-reflectivity film
201. n-type InP substrate
202. InGaAlAs strained MQW active region
203. InGaAsP optical waveguide layer
204. Diffraction grating
205. p-type InP cladding layer and p$^+$-InGaAs contact layer
206. Top electrode
207. Bottom electrode
209. High-reflectivity film
211. 45-degree mirror
212. Bottom lens
213. Low-reflectivity film
401. 1.3 μm band InGaAlAs-based short cavity multimode laser
402. CAN type module package
403. Cap lens
404. Monitor photodiode
501. Can type module
502. Fiber-integrated ferrule

What is claimed is:
1. A semiconductor laser device comprising:
an active layer region to emit laser light, formed over a first section of a semiconductor substrate;
a waveguide layer region formed over a second section of the semiconductor substrate adjacent to the first section;
a diffraction grating layer formed on the active layer region;

a cladding layer formed so as to cover a section which includes the diffraction grating layer and the waveguide layer;

a top electrode formed in a predetermined section on the cladding layer; and a reflection film which is formed on one side edge of the semiconductor substrate to reflect the laser light emitted in the active layer region;

wherein a length (L) of the active layer region is 10 to 200 μm in length;

a distributed Bragg reflection mirror or a distributed feedback mirror, which comprises the diffraction grating layer and the cladding layer, is formed as an optical feedback system for a laser cavity;

the active layer is so formed that a product (kL) of an optical reflection coefficient (k) of the diffraction grating layer and the length (L) of the active layer region is at least 3; and longitudinal oscillation modes occur simultaneously at plural wavelengths.

2. The semiconductor laser device according to claim 1, wherein an angled mirror is provided at the emitting edge of the waveguide layer or near to the emitting edge so as to change the direction of the emitted laser light.

3. The semiconductor laser device according to claim 2, wherein the slant mirror is inclined by 40 to 50 degrees from the surface of the semiconductor substrate.

4. An optical module comprising:

a package in which a semiconductor laser device according to claim 1 and a component including an optical lens which condenses the laser light emitted from the semiconductor laser device are mounted; and an optical fiber which receives and transmits the laser light which has passed the optical lens, wherein the laser light from the optical lens is guided into the optical fiber with no optical isolator between the optical lens and the optical fiber.

5. An optical module comprising:

a package in which a semiconductor laser device according to claim 1 is mounted; and an optical fiber which receives and transmits the laser light emitted from the semiconductor laser device, wherein the laser light from the semiconductor laser device is guided into the optical fiber by using an optical lens.

* * * * *